United States Patent
Sung et al.

(10) Patent No.: US 11,316,048 B2
(45) Date of Patent: Apr. 26, 2022

(54) TIN OXIDE LAYER, TFT HAVING THE SAME AS CHANNEL LAYER, AND MANUFACTURING METHOD FOR THE TFT

(71) Applicant: INDUSTRY-UNIVERSITY COOPERATION FOUNDATION HANYANG UNIVERSITY, Seoul (KR)

(72) Inventors: Myung Mo Sung, Seoul (KR); Hongbum Kim, Seoul (KR); Hongro Yun, Wonju-si (KR)

(73) Assignee: INDUSTRY-UNIVERSITY COOPERATION FOUNDATION HANYANG UNIVERSITY, Seoul (KR)

(*) Notice: Subject to any disclaimer, the term of this patent is extended or adjusted under 35 U.S.C. 154(b) by 5 days.

(21) Appl. No.: 16/707,003

(22) Filed: Dec. 9, 2019

(65) Prior Publication Data
US 2020/0185518 A1 Jun. 11, 2020

(30) Foreign Application Priority Data

Dec. 10, 2018 (KR) .................. 10-2018-0158551
Nov. 1, 2019 (KR) .................. 10-2019-0138990

(51) Int. Cl.
*H01L 29/22* (2006.01)
*H01L 29/66* (2006.01)
*H01L 29/786* (2006.01)
*H01L 29/221* (2006.01)

(52) U.S. Cl.
CPC .......... *H01L 29/786* (2013.01); *H01L 29/221* (2013.01); *H01L 29/2206* (2013.01); *H01L 29/66742* (2013.01)

(58) Field of Classification Search
CPC ................. H01L 29/786; H01L 29/7869
See application file for complete search history.

(56) References Cited

U.S. PATENT DOCUMENTS

2005/0017244 A1* 1/2005 Hoffman ............. H01L 29/7869
257/72

OTHER PUBLICATIONS

Yanli Pei, Fabrication and Characterization of p-Type SnO Thin Film with High c-Axis Preferred Orientation, Journal of Electronic Materials, vol. 45, No. 11 (Year: 2016).*
Bunaciu et al., X-Ray Diffraction: Instrumentation and Applications, Critical Reviews in Analytical Chemistry, Taylor Francis Group, LLC (Year: 2015).*
Barnes et al., Sources of Peak Broadening, Birkbeck College, University of London. (Year: 1997).*

(Continued)

*Primary Examiner* — Julio J Maldonado
*Assistant Examiner* — Mohammad A Rahman
(74) *Attorney, Agent, or Firm* — Sughrue Mion, PLLC

(57) ABSTRACT

Provided are a tin oxide layer, a thin film transistor (TFT) having the same as a channel layer, and a method for manufacturing the TFT. The TFT comprises a gate electrode, a tin oxide channel layer disposed on the gate electrode and being a polycrystalline thin film with preferred orientation in a [001] direction, a gate insulating film disposed between the gate electrode and the channel layer, and source and drain electrodes electrically connected to both ends of the channel layer, respectively.

17 Claims, 6 Drawing Sheets

(56) References Cited

OTHER PUBLICATIONS

Po-Ching Hsu et al., FilmTexture,HoleTransportandField-EffectMobilityinPolycrystallineSnOThinFilmsonGlass,JSSFocusIssueonOxideThinFilmTransistors. (Year: 2014).*

Yoichi Ogo et al., "p-channel thin-film transistor using p-type oxide semiconductor, SnO", Applied Physics Letters, vol. 93, 2008, pp. 032113-1 to 032113-3 (4 pages total).

Soo Hyun Kim et al. "Fabrication of high-performance $_p$-type thin film transistors using atomic-layer-deposited SnO films", Journal of Materials Chemistry C, 2017, vol. 5, pp. 3139-3145 (7 pages total).

Chu Eun-Ho et al., "Deposition of SnO and using as $_p$-Channel thin-film transistor", The Korean Institute of Surface Engineering, 2014, p. 134 (4 pages total).

* cited by examiner

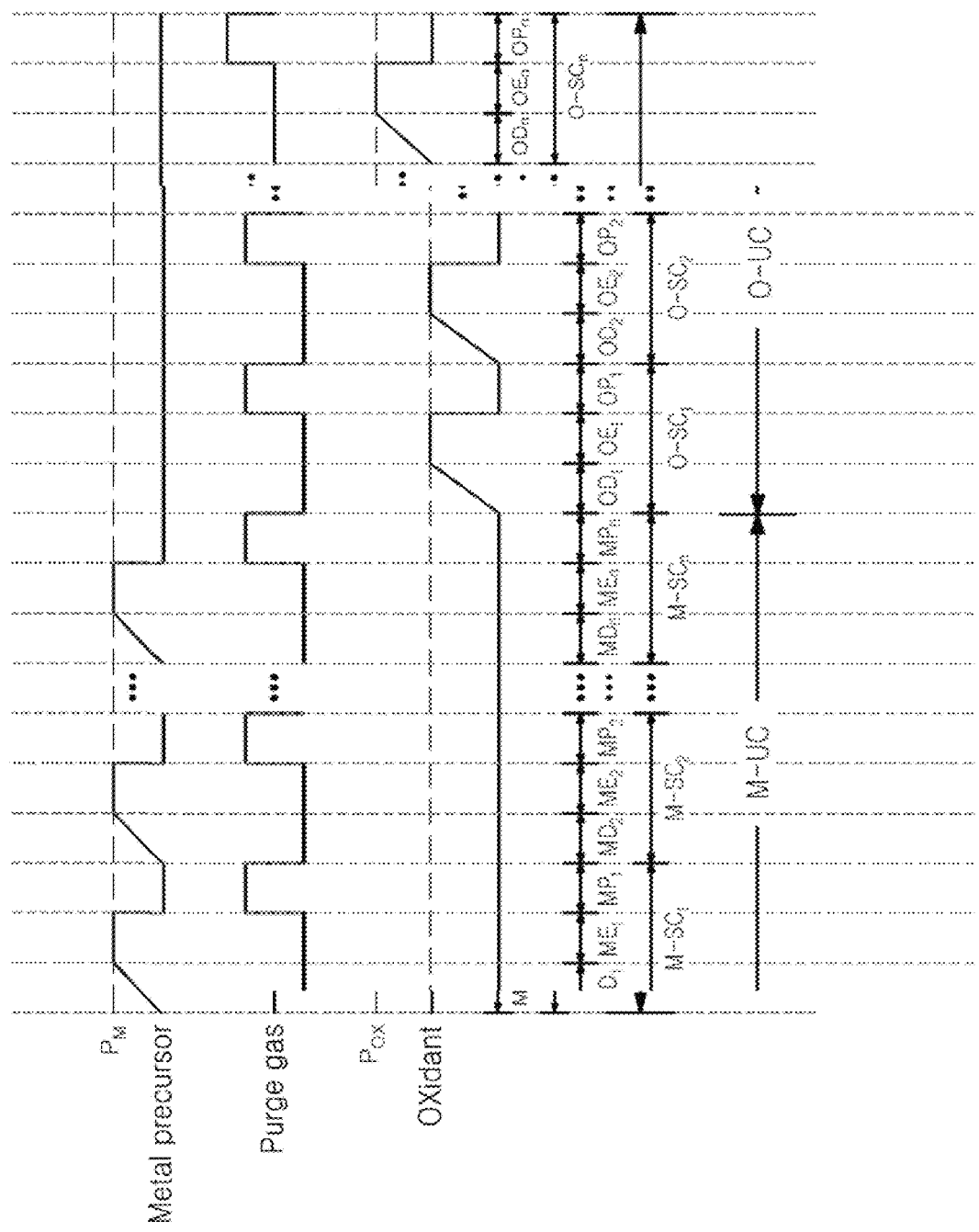

FIG.4
| Sn | P | Sn | P | Sn | P | Sn | P |
|---|---|---|---|---|---|---|---|
| 5s | 40s | 5s | 40s | 5s | 40s | 5s | 40s |
| 50 mTorr | | 50 mTorr | | 50 mTorr | | 50 mTorr | |
| $H_2O$ | P | $H_2O$ | P | $H_2O$ | P | $H_2O$ | P |
| 2s | 40s | 2s | 40s | 2s | 40s | 2s | 40s |
| 300 mTorr | | 300 mTorr | | 300 mTorr | | 300 mTorr | |
FIG.5
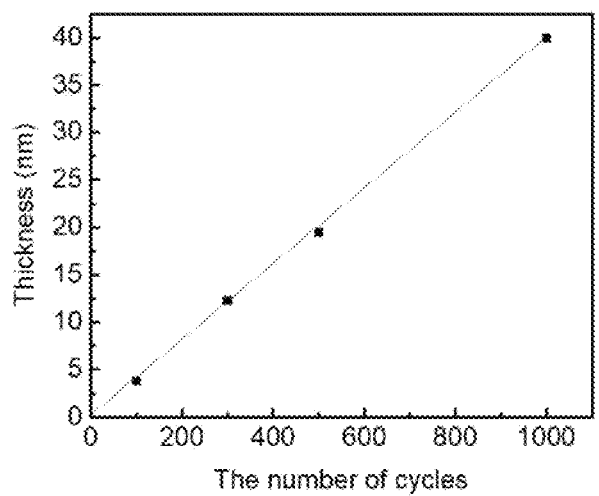
FIG.6A
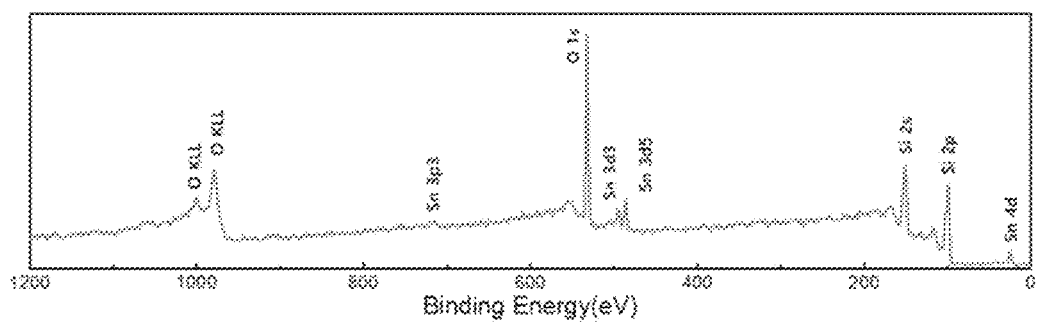

TIN OXIDE LAYER, TFT HAVING THE SAME AS CHANNEL LAYER, AND MANUFACTURING METHOD FOR THE TFT

CLAIM FOR PRIORITY

This application claims priority to Korean Patent Applications No. 10-2018-0158551 filed on Dec. 10, 2018 and No. 10-2019-0138990 filed on Nov. 1, 2019 in the Korean Intellectual Property Office (KIPO), the entire contents of which are hereby incorporated by reference.

BACKGROUND

1. Technical Field

Example embodiments of the present invention relates to a semiconductor layer and a semiconductor device having the same, and more specifically to a thin film transistor.

2. Related Art

As the silicon layer used as a channel layer of a transistor, an amorphous silicon layer or a polycrystalline silicon layer is used depending on the purpose. Recently, as an example of a material other than silicon, researches using an oxide semiconductor as a channel layer of a transistor have been conducted. Oxide semiconductors have excellent transparency and are mainly used in display devices.

In order to form a circuit or the like with an oxide semiconductor, not only an n-type semiconductor but also a p-type semiconductor is required. However, it is known that it is more challenging to implement a p-type oxide semiconductor because most oxide semiconductors are predominately n-type.

SUMMARY

Example embodiments of the present invention provide a manufacturing method for a tin oxide layer with excellent uniformity and growth rate.

Example embodiments of the present invention provide a tin oxide layer having improved charge mobility.

Example embodiments of the present invention provide a thin film transistor including a tin oxide layer having improved charge mobility as a channel layer.

Example embodiments of the present invention provide a thin film transistor. The thin film transistor comprises a gate electrode, a tin oxide channel layer disposed on the gate electrode and being a polycrystalline thin film with preferred orientation in a [001] direction, a gate insulating film disposed between the gate electrode and the channel layer, and source and drain electrodes electrically connected to both ends of the channel layer, respectively.

The tin oxide channel layer may be a SnO channel layer. The tin oxide channel layer may include at least one of crystal grains grown in [101], [110], and [103] directions in addition to crystal grains grown in the [001] direction. In an X-ray diffraction (XRD) spectrum of the tin oxide channel layer, [101] and [110] peaks may appear as one peak. [001] peak in an XRD spectrum of the tin oxide channel layer may show a FWHM (full width at half maximum) of 0.1 to 1 degree.

Example embodiments of the present invention provide a manufacturing method for a thin film transistor comprising preparing a substrate, and forming a tin oxide channel layer on the substrate. The step of forming the tin oxide channel layer comprises injecting the substrate into a chamber having a gas inlet and a gas outlet. A tin oxide layer is formed on the substrate by performing a plurality of unit cycles including a tin precursor pressurized dosing step of adsorbing a tin precursor onto a surface of the substrate by supplying the tin precursor into the chamber while the gas outlet is closed, a tin precursor purge step of purging the chamber after the tin precursor pressurized dosing step, an oxidant supplying step of supplying an oxidant into the chamber after the tin precursor purge step to oxidize the tin precursor adsorbed on the substrate to form tin oxide, and a oxidant purge step of purging the chamber after the oxidant supplying step. The tin oxide layer is heat treated. The tin oxide channel layer is a polycrystalline thin film with preferred orientation in a [001] direction.

The tin oxide channel layer may be a SnO channel layer. The tin oxide channel layer may include at least one of crystal grains grown in [101], [110], and [103] directions in addition to crystal grains grown in the [001] direction. In an XRD spectrum of the tin oxide channel layer, [101] and [110] peaks may appear as one peak. [001] peak in an XRD spectrum of the tin oxide channel layer may show a FWHM of 0.1 to 1 degree.

The tin precursor may be tin (II)-organic compound or tin (IV)-organic compound. The tin precursor may have at least one $[((C_1-C_5)alkyl)_n silyl]_m$ amino group (n is 1, 2, or 3 and m is 1 or 2) as a ligand, wherein n may be 3 and m may be 2. The tin precursor may be $(TMSA)_2Sn(II)$ (bis[bis(trimethylsilyl)amino] tin (II)). The heat treating may be performed in a temperature range of more than 280° C. to 400° C. in an inert gas atmosphere.

The tin precursor pressurized dosing step and the tin precursor purge step may constitute a tin precursor subcycle. The tin precursor subcycle may be performed multiple times before the oxidant supplying step. The oxidant supplying step may be an oxidant pressurized dosing step including supplying the oxidant into the chamber while the outlet of the chamber is closed to increase a pressure in the chamber. The oxidant pressurized dosing step and the oxidant purge step may constitute an oxidant subcycle, and the unit cycle may include performing the oxidant subcycle several times in succession.

Example embodiments of the present invention provide tin oxide layer. The tin oxide layer is a polycrystalline thin film preferentially grown in [001] direction and includes at least one of crystal grains grown in [101], [110], and [103] directions in addition to crystal grains grown in the [001] direction. In an XRD spectrum of the tin oxide layer, [101] and [110] peaks may appear as one peak.

BRIEF DESCRIPTION OF DRAWINGS

Example embodiments of the present invention will become more apparent by describing in detail example embodiments of the present invention with reference to the accompanying drawings, in which:

FIG. 1A is a timing diagram of metal precursor gas injection, purge gas injection, and oxidant gas injection for preparing of a tin oxide layer in accordance with one embodiment of the present invention.

FIG. 4 is a table showing parameters of a unit cycle for preparing a tin oxide thin film according to Preparation Example A.

FIG. 5 is a graph showing the thickness according to the number of unit cycles of the tin oxide thin film according to the tin oxide thin film preparation example A.

FIGS. 6A and 6B, respectively, show XPS (X-ray Photoelectron Spectroscopy) spectra and high-resolution XPS spectra of tin oxide thin film according to the tin oxide thin film preparation example A.

DESCRIPTION OF EXAMPLE EMBODIMENTS

Figure 1B:
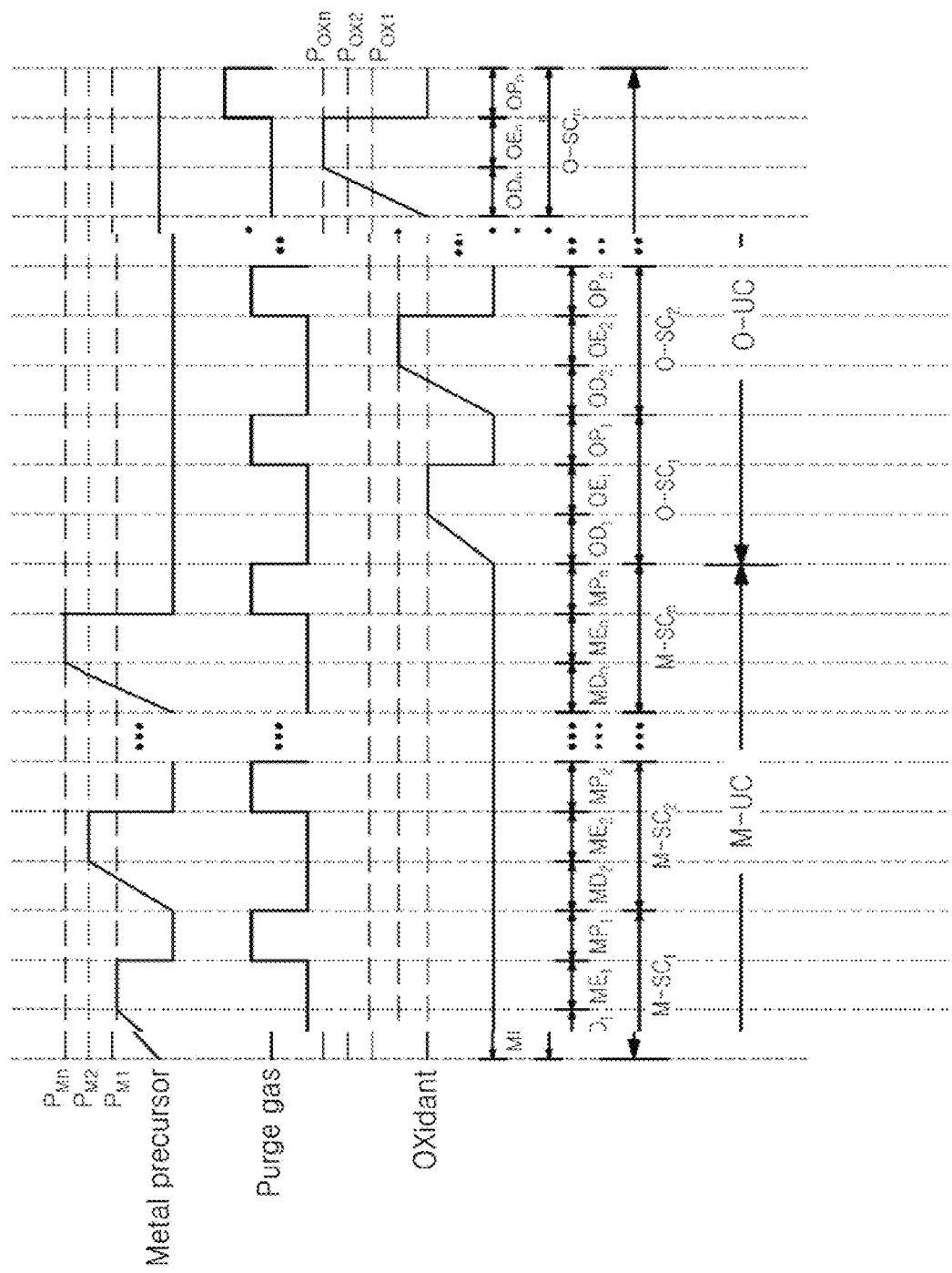
FIG. 1B is a timing diagram of metal precursor gas injection, purge gas injection, and oxidant gas injection for preparing of a tin oxide layer in accordance with another embodiment of the present invention.

Hereinafter, to more fully explain the present invention, embodiments according to the present invention will be described in further detail with reference to the accompanying drawings. However, the present invention may be embodied in different forms without limitation to the embodiments explained herein. Like reference numerals denote like elements throughout the specification. In the specification, the sentence "a first layer is disposed "on" a second layer" means that these layers are in direct contact with each other, and a third layer(s) is/are disposed between these layers. In the present embodiments, "first", "second", or "third" is not intended to impose any limitation on the components, but should be understood as a term for distinguishing the components.

In the present specification, when "Cx-Cy" is described, the case having the number of carbon atoms corresponding to all integers between the carbon number x and the carbon number y should also be interpreted as being described together.

Figure 2:
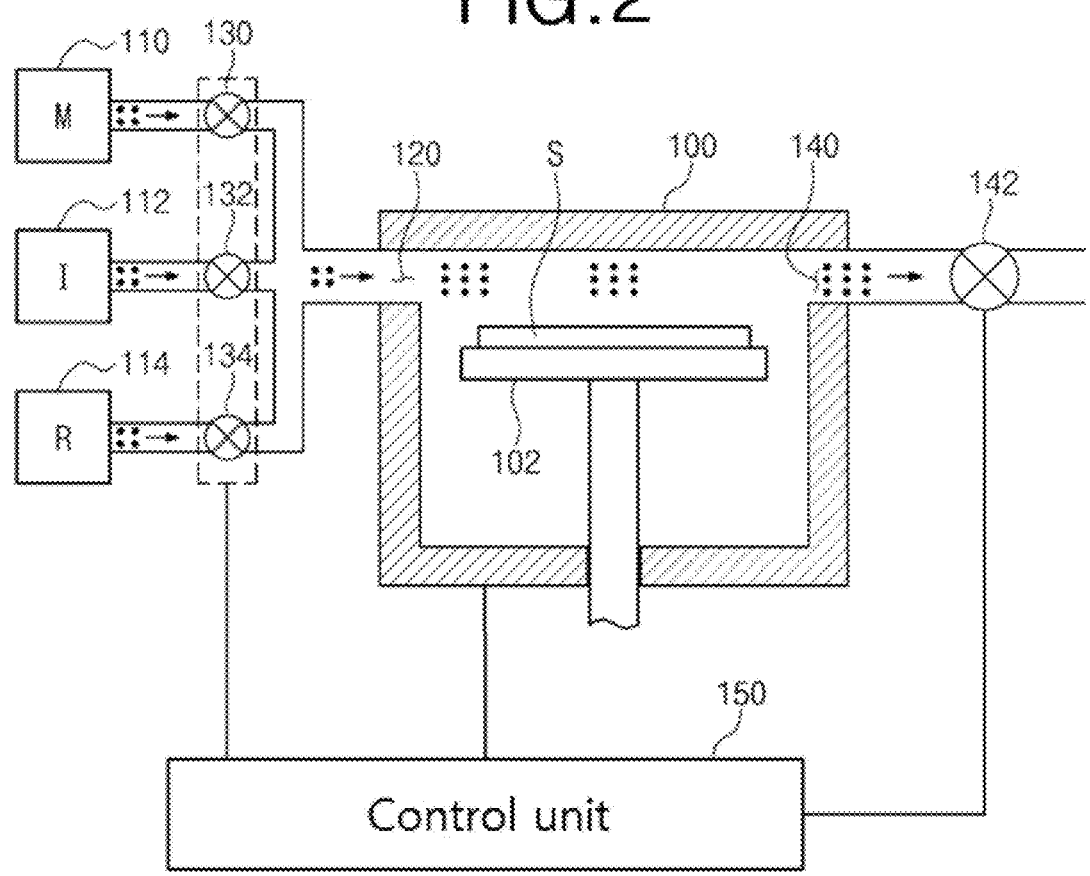
FIG. 2 is a schematic view showing a thin film manufacturing apparatus according to an embodiment of the present invention.

FIG. 1A is a timing diagram of metal precursor gas injection, purge gas injection, and oxidant gas injection for preparing of a tin oxide layer in accordance with one embodiment of the present invention. FIG. 1B is a timing diagram of metal precursor gas injection, purge gas injection, and oxidant gas injection for preparing of a tin oxide layer in accordance with another embodiment of the present invention. FIG. 2 is a schematic view showing a thin film manufacturing apparatus according to an embodiment of the present invention.

FIGS. 1A, 1B, and 2, a substrate S may be loaded onto a stage 102 in a chamber 100 having the gas inlet 120 and the gas outlet 140. Before loading the substrate S, the chamber 100 may be heated and maintained at a deposition temperature by a control unit 150. The deposition temperature may be 20 to 250° C., 50 to 200° C., 80 to 150° C., 90 to 100° C., or 95 to 105° C. The gas outlet 140 may be connected to a vacuum pump.

All gas control valves 130, 132, and 134 connected to the gas inlet 120 may be closed, and a gas outlet valve 142 connected to the gas outlet 140 may be opened to make the inside of the chamber 100 vacuum.

Thereafter, in the state where the tin precursor gas control valve 130 is opened and the gas outlet valve 142 is closed, a tin precursor gas may be supplied into the chamber 100 from a tin precursor storage unit 110. The tin precursor may be a tin-organic compound, which may be a tin(II)-organic compound or a tin(IV)-organic compound. The tin precursor may include, for example, tin (II) or tin (IV) as a central metal ion and, may have at least one ligand selected from the group consisting of a $[((C_1\text{-}C_5) \text{alkyl})_n \text{silyl}]_m$ amino group (n may be 1, 2, or 3 and m may be 1 or 2), silyl($C_1$-$C_5$)alkyl amino group, (silyl ($C_1$-$C_5$)alkyl)$_m$ amino group (m may be 1 or 2), (($C_1$-$C_5$)alkyl)$_m$ amino group (m may be 1 or 2), ($C_1$-$C_5$)alkyl alkoxy group, and (($C_1$-$C_5$)alkyl)$_m$ amino($C_1$-$C_5$) alkoxy group (m may be 1 or 2). The tin precursor may be, for example, (TMSA)$_2$Sn (II) (bis[bis(trimethylsilyl) amino] tin(II)), TDEASn (IV) (tetrakis (diethylamino) tin (IV)), TDMASn (IV) (tetrakis(dimethylamido) tin (IV)), Sn(acac)$_2$ (Tin (II) acetylacetonate), Sn(edpa)$_2$ (bis(N-ethoxy-2,2-dimethyl propanamido) tin (II), Sn(dmamp)$_2$ (bis (dimethylamino-2-methyl-2-propoxy) tin (II)), or a combination thereof. In one embodiment, the tin precursor may have at least one, specifically, two of $[((C_1\text{-}C_5)\text{alkyl})_n \text{silyl}]_m$ amino group (n may be 1, 2, or 3 and m may be 1 or 2) as ligand(s). As an example, the ligand may be $[((C_1\text{-}C_5)\text{alkyl})_n \text{silyl}]_m$ amino group (n may be 3 and m may be 2). Specifically, the tin precursor may be (TMSA)$_2$ Sn (II).

The tin precursor may be stored in a solid or liquid state in the tin precursor storage unit 110. The tin precursor storage unit 110 may be heated below the pyrolysis temperature of the tin precursor so that the tin precursor may be supplied into the chamber 100 at a predetermined vapor pressure. The tin precursor may be supplied without a carrier gas. Since the tin precursor is supplied while the gas outlet valve 142 is closed, the tin precursor may be accumulated in the chamber 100 and increase the pressure in the chamber 100. The tin precursor may be supplied until the pressure of the chamber 100 reaches the reaction pressure $P_M$ (tin precursor supplying step, $MD_1$). The reaction pressure, i.e., the pressure of the tin precursor gas, may range from tens to hundreds of mTorr, specifically from 20 to 200 mTorr, from 25 to 150 mTorr, from 30 to 120 mTorr, from 35 to 100 mTorr, from 40 to 80 mTorr, or from 45 to 60 mTorr.

When the reaction pressure $P_M$ is reached, the tin precursor gas control valve 130 may be closed and the chamber may be sealed for a predetermined time (tin precursor exposing step, $ME_1$). The tin precursor supplying step $MD_1$ and the tin precursor exposing step $ME_1$ may be referred to as a tin precursor pressurized dosing step. However, the tin precursor exposing step $ME_1$ may be omitted in some cases.

In the tin precursor pressurized dosing step, that is, the tin precursor supplying step $MD_1$ and the tin precursor exposing step $ME_1$, the tin precursor gas may be deposited by chemisorption and a self-saturated reaction on the surface of the substrate or on the surface of the layer previously formed on the substrate. As the chemisorption and self-saturated reaction of the tin precursor gas proceed in a pressurized environment such as in a pressurized stagnant environment, not in a lamina flow environment, the rate of chemisorption or surface coverage on the substrate or on the surface of the layer previously formed on the substrate can be greatly improved.

The chamber may then be purged (tin precursor purge step, $MP_1$). Specifically, the excess tin precursor gas which is not adsorbed on the surface of the substrate and the reaction product produced by the reaction between the tin precursor gas and the surface of the substrate can be removed while opening the purge gas control valve 132 and the gas outlet valve 142 to flow the purge gas from the purge gas storage unit 112 onto the substrate surface in the chamber. In this case, the purge gas may be an inert gas, and the inert gas may include, for example, a gas such as argon (Ar), nitrogen ($N_2$), or a combination thereof.

The tin precursor pressurized dosing step ($MD_n$, $ME_n$) and tin precursor purge step ($MP_n$) may constitute a tin precursor subcycle ($M\text{-}SC_n$), the tin precursor subcycle ($M\text{-}SC_n$) may be performed once to multiple times, specifically, 1 to 10 times (n=1 to 10), for example, 2 to 7 times (n=2 to 7), or 3 to 5 times (n=3 to 5). The plurality of tin precursor subcycles ($M\text{-}SC_n$) may constitute a tin precursor unit cycle (M-UC). When performing the tin precursor subcycles multiple times ($M\text{-}SC_1, \ldots M\text{-}SC_n$, n≥2), in the embodiment as shown in FIG. 1A, the reaction pressure $P_M$ at tin precursor pressurized dosing steps ($MD_1$, $MD_2$, ... $MD_n$, $ME_1$, $ME_2$, $ME_n$, n≥2) may be substantially the same, and in the embodiment as shown in FIG. 1B, the reaction pressures $P_{M1}$, $P_{M2}$, ... $P_{Mn}$ at tin precursor pressurized dosing steps ($MD_1$, $MD_2$, ... $MD_n$, $ME_1$, $ME_2$, ... $ME_n$, n≥2) may be different. In FIG. 1B, the reaction pressures $P_{M1}$, $P_{M2}$, ... $P_{Mn}$ are shown to gradually increase as the number of tin precursor pressurized dosing steps ($MD_1$, $MD_2$, ... $MD_n$, $ME_1$, $ME_2$, ... $ME_n$, n≥2) increases, but are not limited thereto. As another example, the reaction pressures $P_{M1}$, $P_{M2}$, ... $P_{Mn}$ may gradually decrease.

After performing the tin precursor unit cycle (M-UC), an oxidant supply step (oxidant supplying step, $OD_1$) may be performed to supply an oxidant into the chamber to oxidize the tin precursor adsorbed on the substrate to form a tin oxide unit layer. In one embodiment, with the oxidant gas control valve 134 open and the gas outlet valve 142 closed, the oxidant gas may be supplied into the chamber 100 from the oxidant storage unit 114. Since the oxidant is supplied while the gas outlet valve 142 is closed, the oxidant may be accumulated in the chamber 100 and increase the pressure in the chamber 100. The oxidant may be supplied until the pressure in the chamber 100 reaches the reaction pressure $P_{OX}$. The reaction pressure $P_{OX}$, i.e., the pressure of the oxidant gas, may be in the range of 100 mTorr to several Torr, specifically 100 mTorr to 1 Torr, 150 to 500 mTorr, 200 to 400 mTorr, or 250 to 350 mTorr.

The oxidant may be $H_2O$, $H_2O_2$, or $O_3$, but is not limited thereto. In one embodiment, the oxidant may be $H_2O$. When the oxidant is $H_2O$ or $H_2O_2$, the oxidant may be stored in the liquid state in the oxidant storage unit 114. The oxidant storage unit 114 may be heated and the oxidant may be supplied into the chamber 100 at a predetermined vapor pressure. In one embodiment, the oxidant may be supplied without a carrier gas.

When the reaction pressure $P_{OX}$ is reached, the oxidant gas control valve 134 may be closed to seal the chamber for a predetermined time (oxidant exposing step, $OE_1$). The oxidant supplying step $OD_1$ and the oxidant exposing step $OE_1$ may be referred to as an oxidant pressurized dosing step. However, the oxidant exposing step $OE_1$ may be omitted in some cases.

In the oxidant pressurized dosing step, that is, the oxidant supplying step $OD_1$ and the oxidant exposing step $OE_1$, an oxidant gas may react with the tin precursor layer formed on the substrate to oxidize the tin precursor layer to form a tin oxide unit layer. As such, the reaction of the oxidant gas with the tin precursor layer may proceed in a pressurized environment, specifically, a pressurized stagnant environment rather than a lamina flow environment. However, the present invention is not limited thereto, and the oxidant gas may be supplied with the gas outlet valve 142 open to react with the tin precursor layer in a state of a lamina flow in the chamber.

Thereafter, the chamber may be purged (oxidant purge step, $OP_1$). Specifically, the purge gas control valve 132 and the gas outlet valve 142 may be opened, and then the purge gas from the purge gas storage unit 112 may flow onto the substrate surface to remove the excess oxidant gas which have not reacted with the tin precursor layer and the reaction product produced by the reaction between and the tin precursor layer and the oxidant gas. In this case, the purge gas may be an inert gas, and the inert gas may include, for example, a gas such as argon (Ar), nitrogen ($N_2$), or a combination thereof.

The oxidant pressurized dosing step ($OD_1$, $OE_1$) and oxidant purge step ($OP_1$) may constitute a oxidant subcycle ($O\text{—}SC_1$), the oxidant subcycle ($O\text{—}SC_n$) may be performed once to multiple times, specifically, 1 to 10 times (n=1 to 10), for example, 2 to 7 times (n=2 to 7), or 3 to 5 times (n=3 to 5). The plurality of oxidant subcycles ($O\text{—}SC_n$) may constitute a oxidant unit cycle (O-UC). When performing the oxidant subcycles multiple times ($O\text{—}SC_1, O\text{—}SC_2, \ldots O\text{—}SC_n$, n≥2), in the embodiment as shown in FIG. 1A, the reaction pressure $P_{OX}$ at oxidant pressurized dosing steps ($OD_1$, $OD_2$, ... $OD_n$, $OE_1$, $OE_2$, ... $OE_n$, n≥2) may be substantially the same, and in the embodiment as shown in FIG. 1B, the reaction pressures $P_{OX1}$, $P_{OX2}$, ... $P_{OXn}$ at oxidant pressurized dosing steps ($OD_1$, $OD_2$, ... $OD_n$, $OE_1$, $OE_2$, ... n≥2) may be different. In FIG. 1B, the reaction pressures $P_{OX1}$, $P_{OX2}$, ... $P_{OXn}$ are shown to gradually increase as the number of oxidant pressurized dosing steps ($OD_1$, $OD_2$, ... $OD_n$, $OE_1$, $OE_2$, ... $OE_n$, n≥2) increases, but are not limited thereto. As another example, the reaction pressures $P_{OX1}$, $P_{OX2}$, ... $P_{OXn}$ may gradually decrease.

When each of the tin precursor unit cycle (M-UC) and the oxidant unit cycle (O-UC) is performed once, the tin oxide unit layer may be formed to a thickness of about 0.2 to 0.5 Å, specifically 0.25 to 0.45 Å. Thereafter, the tin precursor unit cycle (M-UC) and the oxidant unit cycle (O-UC) may be alternately repeated. The number of iterations may determine the final thickness of the tin oxide layer. Since the adsorption of the tin precursor gas proceeded in a pressurized stagnant environment with a high reaction pressure in forming the tin oxide layer, a very high thickness per unit cycle can be obtained compared to the thickness per unit cycle in a general ALD (Atomic Layer Deposition) method, in which, dosing a tin precursor in a lamina flow environment rather than a pressurized environment. Furthermore, the obtained tin oxide layer has excellent surface morphology, such as surface roughness of several Å root mean square (RMS), which is very low, such as 0.1 to 0.5 nm (RMS), specifically 0.2 to 0.3 nm (RMS).

The tin oxide layer formed by the method described with reference to FIGS. 1A and 1B may be heat treated. The heat treatment may be performed in an inert gas atmosphere, for example in an argon atmosphere. The heat treatment may be performed at greater than 280° C. and at most 400° C., for example, at 300 to 350° C., 290 to 330° C., 295 to 310° C., or 300 to 305° C.

By such heat treatment, a polycrystalline tin oxide layer can be obtained. This polycrystalline tin oxide layer may be a tin (II) oxide layer, that is, a SnO layer, preferentially oriented in the [001] direction. In addition, the tin oxide layer may be a p-type semiconductor layer. Specifically, at least one of crystal grains grown in the [101], [110], and

[103] directions in addition to crystal grains grown in the [001] direction may be provided in the tin oxide layer.

This tin oxide layer may exhibit at least one peak of [101], [110], and [103] peaks in addition to the [001] peak in the X-ray diffraction (XRD) spectrum. At this time, the peaks [101] and [110] may be combined to appear as one peak. Specifically, one peak may appear in the region where 2θ ranges from about 25 to 35 degrees (°). In addition, the intensity of the [001] peak is higher than intensities of the other peaks, in particular, the [101] peak and/or the [103] peak, and the full width at half maximum of the [001] peak may be smaller than that of the [101] peak and/or [103] peak. Specifically, the full width at half maximum of the [001] peak may represent a value of about 1 degree (°) or less, for example, 0.1 to 0.9, 0.2 to 0.85, 0.3 to 0.8, 0.4 to 0.75, 0.5 to 0.7, or 0.6 to 0.65 degrees (°).

Figure 3:
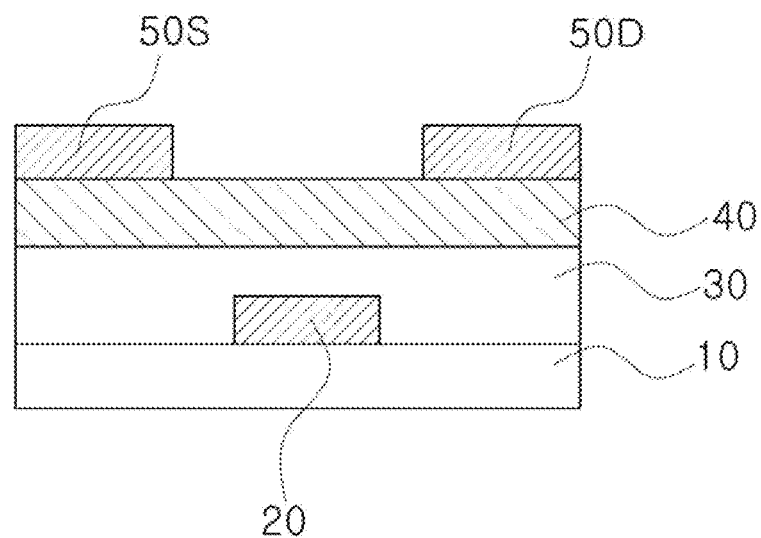
FIG. 3 is a cross-sectional view illustrating a thin film transistor according to an exemplary embodiment of the present invention.

FIG. 3 is a cross-sectional view illustrating a thin film transistor according to an exemplary embodiment of the present invention.

Referring to FIG. 3, a substrate 10 may be provided. The substrate may be a semiconductor substrate, a metal substrate, a glass substrate, or a flexible substrate. For example, the flexible substrate may be a polymer substrate, for example, polyethylene terephthalate (PET) or polyimide (PI) substrate. Elements for operating circuits or the like may be formed on the substrate 10, or a protective layer (not shown) such as an insulating layer covering the substrate or the element may be formed.

The surface of the substrate 10 may be cleaned and surface treated if necessary.

The gate electrode 20 extending in one direction may be formed on the substrate 10. The gate electrode 20 may be formed using Al, Cr, Cu, Ta, Ti, Mo, W, or an alloy thereof. A gate insulating layer 30 may be formed on the gate electrode 20. The gate insulating layer 30 may be a silicon oxide layer, a silicon oxynitride layer, an aluminum oxide layer, an aluminum oxynitride layer, or a composite layer thereof. The gate insulating layer 30 may be formed using an atomic layer deposition method, and may be, for example, an aluminum oxide layer.

A tin oxide channel layer 40 may be formed on the gate insulating layer 30 to cross the upper portion of the gate electrode 20. However, depending on the type of the thin film transistor construction, the lower layer where the tin oxide channel layer 40 is formed may vary. The tin oxide channel layer 40 may be formed by performing a pressurized ALD as described with reference to FIG. 1A or 1B on the substrate including the gate insulating layer 30 to form a tin oxide layer, heat treating the tin oxide layer, and patterning the heat-treated tin oxide layer. The heat treatment may be performed in an inert gas atmosphere, for example an argon atmosphere. The heat treatment may be performed at greater than 280° C. and at most 400° C., for example, at 300 to 350° C., 290 to 330° C., 295 to 310° C., or 300 to 305° C.

The tin oxide layer after deposition according to the pressurized ALD and before heat treatment may be a layer having an amorphous matrix and crystal grains crystallized in different directions dispersed in the amorphous matrix.

During the heat treatment, as the crystal grains crystallized in different directions dispersed in the amorphous matrix grow to form grain boundaries, so that the tin oxide layer may be changed into a polycrystalline thin film which is the tin oxide channel layer 40. The tin oxide channel layer 40 may be a tin (II) oxide layer, for example a SnO layer, a preferentially grown in the [001] direction. In addition, the tin oxide channel layer 40 may be a p-type semiconductor layer. Specifically, the tin oxide channel layer 40 may include at least one of crystal grains grown in the [101], [110], or [103] direction in addition to crystal grains grown in the [001] direction. The tin oxide channel layer 40 may exhibit at least one peak of [101], [110], and [103] peaks in addition to the [001] peak in the X-ray diffraction (XRD) spectrum. The peaks [101] and [110] may be combined to appear as one peak. Specifically, one peak may appear in the region where 2θ ranges from about 25 to 35 degrees. In addition, the intensity of the [001] peak may be higher than the intensities of the other peaks, in particular, the intensity of the [101] peak and/or the [103] peak, and the full width at half maximum of the [001] peak may be smaller than the full width at half maximum of the [101] peak and/or the [103] peak. Specifically, the full width at half maximum of the [001] peak may represent a value of about 1 degree or less, for example, 0.1 to 0.9, 0.2 to 0.85, 0.3 to 0.8, 0.4 to 0.75, 0.5 to 0.7, or 0.6 to 0.65 degrees (°). The tin oxide channel layer 40 may have a thickness of 7 nm or more, 7 to 50 nm, 8 to 20 nm, or 9 to 15 nm.

A source electrode 50S and a drain electrode 50D may be formed on both ends of the tin oxide channel layer 40. The source electrode 50S and the drain electrode 50D may include at least one metal of aluminum (Al), neodymium (Nd), silver (Ag), chromium (Cr), titanium (Ti), tantalum (Ta), and molybdenum (Mo), or an alloy containing one of them, or a metal oxide conductive layer, for example, indium tin oxide (ITO).

In FIG. 3, as an example of the thin film transistor, a bottom gate-top contact type, that is, a bottom gate staggered thin film transistor is illustrated, but is not limited thereto. The present invention is also applicable to a thin film transistor of a bottom gate-bottom contact type (bottom gate coplanar type), a top gate-bottom contact type (top gate staggered type), or a top gate-top contact type (top gate coplanar type). In the case of the top gate type, the tin oxide channel layer 40 may be disposed to cross the gate electrode G under the gate electrode G. Further, the thin film transistor may be modified in various forms such as a vertical thin film transistor.

Hereinafter, examples are provided to help in understanding the present invention. However, the following examples are merely provided to help in understanding of the present invention, and the present invention is not limited to the following examples.

Tin Oxide Thin Film Preparation Example A

FIG. 4 is a table showing parameters of a unit cycle for preparing a tin oxide thin film according to Preparation Example A.

A silicon substrate was loaded into a chamber having a gas inlet and a gas outlet, and the chamber was heated to 100° C. With the gas outlet closed, a tin (II) precursor, Sn (II) (TMSA)$_2$ (bis [bis(trimethylsilyl)amino] tin (II)), was supplied onto the substrate through the gas inlet (tin precursor supplying step). The tin (II) precursor was supplied without a carrier gas and supplied until the pressure in the chamber reached 50 mTorr. Thereafter, the chamber inlet was also closed to react the tin (II) precursor with the surface of the substrate for 5 seconds while maintaining the chamber pressure at 50 mTorr (tin precursor exposing step). Subsequently, argon, which is a purge gas, was supplied through the gas inlet for 40 seconds while both the gas inlet and the gas outlet were opened (tin precursor purge step). The tin precursor supplying step, the tin precursor exposing step, and the tin precursor purge step constituted a tin precursor subcycle, and the tin precursor subcycle was repeated four times to form a tin atomic layer.

Thereafter, while the gas outlet was closed, H$_2$O as an oxidant was supplied onto the tin atomic layer through the gas inlet (oxidant supplying step). The oxidant was supplied without a carrier gas and supplied until the pressure in the chamber reached 300 mTorr. Thereafter, the chamber inlet was also closed to allow H$_2$O to react with the surface of the tin atomic layer for 2 seconds while maintaining the chamber pressure at 300 mTorr (oxidant exposing step). Thereafter, argon, a purge gas, was supplied through the gas inlet for 40 seconds while both the gas inlet and the gas outlet were opened to purge the reaction product and the remaining reaction gas (oxidant purge step). The oxidant supplying step, the oxidant exposing step, and the oxidant purge step constituted an oxidant subcycle, and the oxidant subcycle was repeated four times to form an oxygen atom layer on the tin atomic layer. As a result, a tin oxide unit layer was formed.

The four indium precursor subcycles and the four oxidant subcycles constitute a unit cycle for tin oxide thin film preparation.

FIG. 5 is a graph showing the thickness according to the number of unit cycles of the tin oxide thin film according to the tin oxide thin film preparation example A. Specifically, the thickness of the tin oxide thin film obtained by performing 100, 300, 500, and 1000 repetitions of the unit cycle according to the tin oxide thin film preparation example A was measured and plotted.

Referring to FIG. 5, when the deposition temperature is 100° C., the growth rate per unit cycle of the tin oxide unit layer is 0.4 Å/cycle.

Figure 6B:
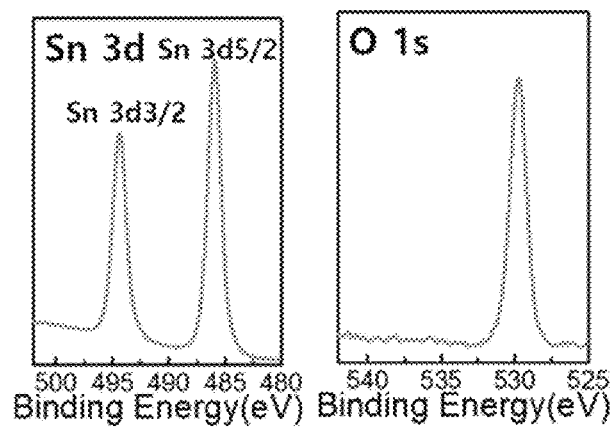

FIGS. 6A and 6B, respectively, show XPS (X-ray Photoelectron Spectroscopy) spectra and high-resolution XPS spectra of tin oxide thin film according to the tin oxide thin film preparation example A. The tin oxide thin film is a thin film obtained by performing 350 unit cycles described in the tin oxide thin film preparation example A.

Referring to FIGS. 6A and 6B, it can be seen that the tin oxide thin film according to the tin oxide thin film preparation example A contains Sn and O.

Figure 7:
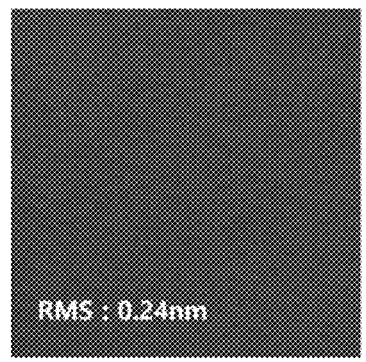
FIG. 7 is an atomic force microscopy (AFM) image of a tin oxide thin film according to a tin oxide thin film preparation example A.

FIG. 7 is an atomic force microscopy (AFM) image of a tin oxide thin film according to a tin oxide thin film preparation example A. The tin oxide thin film is a thin film having a thickness of about 14 nm obtained by performing 350 unit cycles described in the tin oxide thin film preparation example A.

Referring to FIG. 7, the tin oxide thin film exhibits a root mean square roughness (RMS) value of about 0.24 Å, indicating that the tin oxide thin film has a very low surface roughness.

Tin Oxide Thin Film Preparation Example B

The thin film according to Tin Oxide Thin Film Preparation Example A was heat-treated at 300° C. for 5 hours at 1 Torr pressure in an argon atmosphere.

Figure 8:
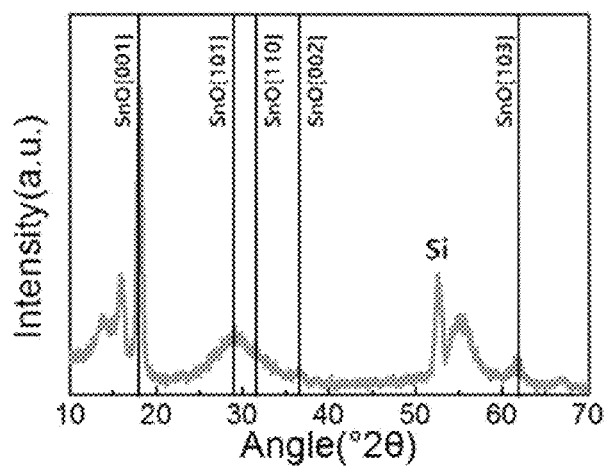
FIG. 8 shows X-ray diffraction (XRD) spectra of a thin film according to Tin Oxide Thin Film Preparation Example B.

FIG. 8 shows X-ray diffraction (XRD) spectra of a thin film according to Tin Oxide Thin Film Preparation Example B.

Referring to FIG. 8, the thin film according to Tin Oxide Thin Film Preparation Example B shows [001], [101], [110], [002] and [103] peaks which are characteristic peaks of tin (II) oxide. The peaks [101] and [110] appear as one peak. Specifically, it can be seen that one peak appears in the region where 2θ is about 25 to 35 degrees. The intensity of the [001] peak of the tin oxide thin film is higher than intensities of other peaks, and in particular, the intensity of the [001] peak is higher than that of the [101] peak and that of the [103] peak. Further, it can be seen that the FWHM (full width at half maximum) of the [001] peak is smaller than that of the [101] peak or the [103] peak. Specifically, the FWHM of the [001] peak appears to be about 0.62 degrees. From this result, it can be seen that the thin film according to Tin Oxide Thin Film Preparation Example B is a polycrystalline tin (II) oxide thin film preferentially grown in the [001] direction.

TFT Preparation Examples 1 to 11

After providing a glass substrate, the glass substrate was subjected to solvent ultrasonic cleansing and UV ozone treatment. The treated glass substrate was placed in a high vacuum (less than 1×10$^{-6}$ Torr) atmosphere, and a 70 nm thick aluminum pattern was deposited on the glass substrate using a thermal evaporation method using a shadow mask to form a gate electrode. A 10 nm thick Al$_2$O$_3$ layer serving as a gate insulating film was formed on the gate electrode by using the ALD (atomic layer deposition) method. Specifically, the Al$_2$O$_3$ layer was formed by repeating 27 times of ALD unit cycle including supplying a mixed gas of trimethylaluminum (TMA) (Aldrich, 97%) as an aluminum precursor and argon as a carrier gas for 2 seconds, and supplying argon as a purge gas for 20 seconds to purge the reaction product and the remaining reaction gas, supplying a mixed gas of H$_2$O as an oxidant and argon as a carrier gas for 2 seconds, and purging the reaction product and the remaining reaction gas by supplying argon as a purge gas for 40 seconds. The Al$_2$O$_3$ inorganic nanolayer was grown to a thickness of about 0.1 nm per one unit cycle of the ALD.

The SnO thin film was formed on the Al$_2$O$_3$ layer, which is the gate insulating film, by performing the number of unit cycles described in Tin Oxide Thin Film Preparation Example A as many times as shown in Table 1 below. The SnO thin film was heat-treated for 5 hours at the temperature shown in Table 1 at 1 Torr pressure in an argon atmosphere to form a SnO channel layer. 70 nm thick Al source/drain electrodes were formed on the channel layer by thermal evaporation.

TABLE 1

|  | Number of unit cycles | SnO thin film thickness (Å) | Heat treatment Temp. (° C.) | $I_{on}/I_{off}$ | Mobility (cm$^2$V$^{-1}$S$^{-1}$) |
| --- | --- | --- | --- | --- | --- |
| TFT Preparation Example 1 | 125 | 5 | 300 | — | — |
| TFT Preparation Example 2 | 175 | 7 | 300 | 1.1 × 10$^3$ | 0.41 |
| TFT Preparation Example 3 | 200 | 8 | 300 | 1.1 × 10$^3$ | 0.86 |
| TFT Preparation Example 4 | 225 | 9 | 300 | 5.6 × 10$^2$ | 1.21 |

TABLE 1-continued

|  | Number of unit cycles | SnO thin film thickness (Å) | Heat treatment Temp. (° C.) | $I_{on}/I_{off}$ | Mobility $(cm^2V^{-1}S^{-1})$ |
|---|---|---|---|---|---|
| TFT Preparation Example 5 | 250 | 10 | 300 | $1.3 \times 10^2$ | 1.3 |
| TFT Preparation Example 6 | 375 | 15 | 300 | $1.5 \times 10^2$ | 1.36 |
| TFT Preparation Example 7 | 375 | 15 | 280 | $1.05 \times 10$ | 0.75 |
| TFT Preparation Example 8 | 375 | 15 | 300 | $1.6 \times 10^2$ | 1.51 |
| TFT Preparation Example 9 | 375 | 15 | 310 | $2.2 \times 10^2$ | 1.05 |
| TFT Preparation Example 10 | 375 | 15 | 330 | $1.4 \times 10^2$ | 0.61 |
| TFT Preparation Example 11 | 375 | 15 | 350 | $1.6 \times 10^2$ | 0.25 |

Figure 9:
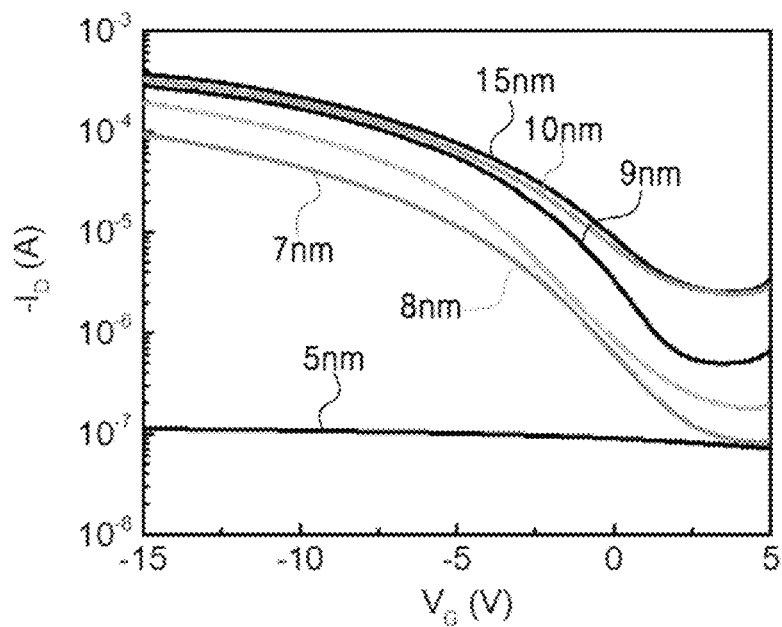
FIG. 9 shows an Id-Vg curve showing transfer characteristics of TFTs according to TFT Preparation Examples 1 to 6.

FIG. 9 shows an Id-Vg curve showing transfer characteristics of TFTs according to TFT Preparation Examples 1 to 6.

Referring to FIG. 9 and Table 1, it can be seen that the TFT including the SnO channel layer exhibits P-type transfer characteristics. When the thickness of the SnO channel layer is 7 nm or more, a distinguishable on state and an off state appear. In addition, the saturation of the charge mobility appears when the thickness of the SnO channel layer is 10 nm or more.

Figure 10:
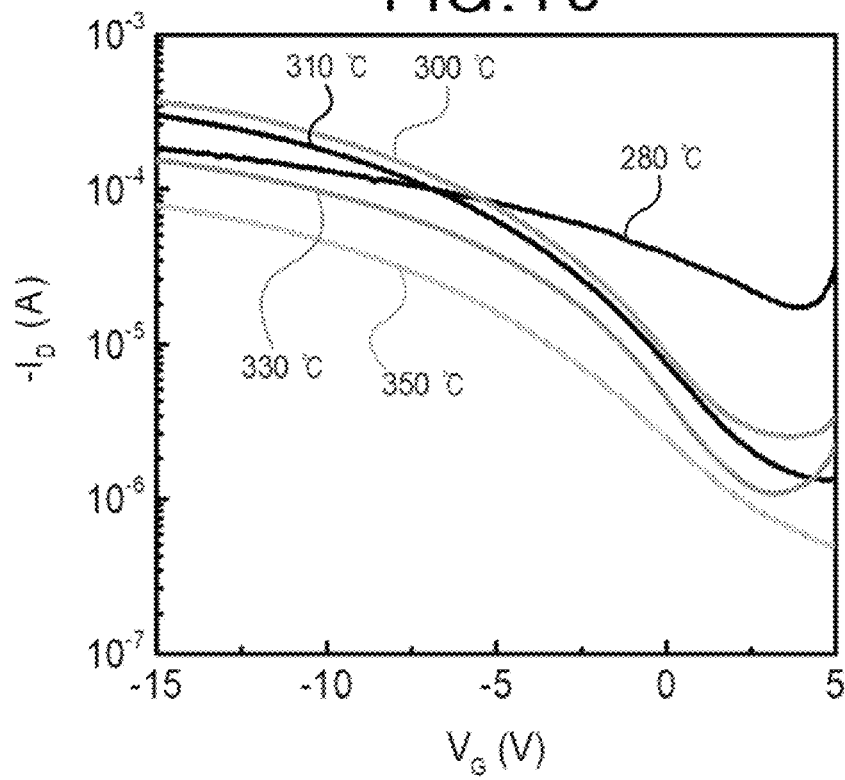
FIG. 10 shows an Id-Vg curve showing transfer characteristics of TFTs according to TFT Preparation Examples 7 to 11.

FIG. 10 shows an Id-Vg curve showing transfer characteristics of TFTs according to TFT Preparation Examples 7 to 11.

Referring to FIG. 10 and Table 1, when the temperature for heat-treating the SnO channel layer is more than 280° C. or 300° C. or more, it appears that the $I_{on}/I_{off}$ value represents 2 orders of magnitude. When the temperature for heat-treating the SnO channel layer is greater than 280 and less than 330° C., specifically, at 290 to 320° C., particularly 300 to 310° C., charge mobility of 1 or more is shown. Specifically, when the temperature for heat-treating the SnO channel layer is at 295 to 305 particularly 300, the best charge mobility is shown.

As described above, according to the present invention, a tin oxide layer may be prepared with excellent uniformity and growth rate. The tin oxide layer may have improved charge mobility. A thin film transistor including the tin oxide layer as a channel layer may have improved charge mobility.

While the exemplary embodiments of the present invention have been described above, those of ordinary skill in the art should understood that various changes, substitutions and alterations may be made herein without departing from the spirit and scope of the present invention as defined by the following claims.

What is claimed is:

1. A thin film transistor comprising:
    a gate electrode;
    a tin oxide channel layer disposed on the gate electrode and being a polycrystalline thin film with preferred orientation in a [001] direction;
    a gate insulating film disposed between the gate electrode and the channel layer; and
    source and drain electrodes electrically connected to both ends of the channel layer, respectively,
    wherein, in an X-ray diffraction (XRD) spectrum of the tin oxide channel layer, [101] and [110] peaks appear as one peak.

2. The thin film transistor of claim 1, wherein the tin oxide channel layer is a SnO channel layer.

3. The thin film transistor of claim 1, wherein the tin oxide channel layer includes all of crystal grains grown in [101], [110], and [103] directions in addition to crystal grains grown in the [001] direction.

4. The thin film transistor of claim 1, wherein, [001] peak in an XRD spectrum of the tin oxide channel layer shows a FWHM (full width at half maximum) of 0.1 to 1 degree.

5. A manufacturing method for the thin film transistor of claim 1 comprising:
    preparing a substrate; and
    forming a tin oxide channel layer on the substrate,
    wherein the step of forming the tin oxide channel layer comprises:
    injecting the substrate into a chamber having a gas inlet and a gas outlet;
    forming a tin oxide layer on the substrate by performing a plurality of unit cycles including a tin precursor pressurized dosing step of adsorbing a tin precursor onto a surface of the substrate by supplying the tin precursor into the chamber while the gas outlet is closed; a tin precursor purge step of purging the chamber after the tin precursor pressurized dosing step; an oxidant supplying step of supplying an oxidant into the chamber after the tin precursor purge step to oxidize the tin precursor adsorbed on the substrate to form tin oxide; and a oxidant purge step of purging the chamber after the oxidant supplying step; and
    heat treating the tin oxide layer,
    wherein the tin oxide channel layer is a polycrystalline thin film with preferred orientation in a [001] direction,
    wherein, in an X-ray diffraction (XRD) spectrum of the tin oxide channel layer, [101] and [110] peaks appear as one peak.

6. The manufacturing method of claim 5, wherein the tin oxide channel layer is a SnO channel layer.

7. The manufacturing method of claim 5, wherein the tin oxide channel layer includes all of crystal grains grown in [101], [110], and [103] directions in addition to crystal grains grown in the [001] direction.

8. The manufacturing method of claim 5, wherein [001] peak in an XRD spectrum of the tin oxide channel layer shows a FWHM of 0.1 to 1 degree.

9. The manufacturing method of claim 5, wherein the tin precursor is tin (II)-organic compound or tin (IV)-organic compound.

10. The manufacturing method of claim 9, wherein the tin precursor has at least one $[((C_1$-$C_5)alkyl)_n silyl]_m$, amino group, wherein n is 1, 2, or 3 and m is 1 or 2 as a ligand.

11. The manufacturing method of claim 10, wherein n is 3 and m is 2.

12. The manufacturing method of claim 5, wherein the tin precursor is $(TMSA)_2Sn(II)$ (bis[bis(trimethylsilyl)amino] tin (II)).

13. The manufacturing method of claim 5, wherein the heat treating is performed in a temperature range of more than 280° C. to 400° C. in an inert gas atmosphere.

14. The manufacturing method of claim 5, wherein the tin precursor pressurized dosing step and the tin precursor purge step constitute a tin precursor subcycle,
the tin precursor subcycle is performed multiple times before the oxidant supplying step.

15. The manufacturing method of claim 5, wherein the oxidant supplying step is a oxidant pressurized dosing step including supplying the oxidant into the chamber while the outlet of the chamber is closed to increase a pressure in the chamber.

16. The manufacturing method of claim 15, wherein the oxidant pressurized dosing step and the oxidant purge step constitute an oxidant subcycle, and
the unit cycle includes performing the oxidant subcycle several times in succession.

17. Tin oxide layer being a polycrystalline thin film preferentially grown in [001] direction and including all of crystal grains grown in [101], [110], and [103] directions in addition to crystal grains grown in the [001] direction,
wherein, in an X-ray diffraction (XRD) spectrum of the tin oxide layer, [101] and [110] peaks appear as one peak.

* * * * *